United States Patent
Rousselin

[19]

[11] Patent Number: 5,936,474
[45] Date of Patent: Aug. 10, 1999

[54] OSCILLATOR HAVING CORRECTION ELEMENT SWITCHABLE BY A FUSE

[75] Inventor: Samuel Rousselin, Le Mans, France

[73] Assignee: U.S. Philips Corporation, New York, N.Y.

[21] Appl. No.: 08/973,022
[22] PCT Filed: Mar. 28, 1997
[86] PCT No.: PCT/IB97/00318
§ 371 Date: Nov. 26, 1997
§ 102(e) Date: Nov. 26, 1997
[87] PCT Pub. No.: WO97/37432
PCT Pub. Date: Oct. 9, 1997

[30] Foreign Application Priority Data

Apr. 2, 1996 [FR] France .................. 96 04122

[51] Int. Cl.⁶ .............. H03B 5/04; H03L 7/099; H03L 7/18
[52] U.S. Cl. .............. 331/34; 331/177 V; 331/179
[58] Field of Search .............. 331/34, 177 R, 331/177 V, 179

[56] References Cited

U.S. PATENT DOCUMENTS

| 4,689,581 | 8/1987 | Talbot | 331/1 A |
| 4,816,778 | 3/1989 | Weber | 331/57 |
| 4,868,525 | 9/1989 | Dias | 331/111 |

FOREIGN PATENT DOCUMENTS

| 0324246A1 | 7/1989 | European Pat. Off. . | |
| 2612017 | 9/1988 | France | H03B 5/12 |

Primary Examiner—Siegfried H. Grimm
Attorney, Agent, or Firm—Dicran Halajian

[57] ABSTRACT

An electronic device is disclosed having an oscillation circuit included in a phase-locked loop. The phase-locked loop includes a phase detector and a variable divider having a selected dividing ratio. A control circuit is provided which melts a fuse as a function of the magnitude of the output of the phase detector for each dividing ratio of the divider, indicating a bad or good locking of the loop.

20 Claims, 1 Drawing Sheet

OSCILLATOR HAVING CORRECTION ELEMENT SWITCHABLE BY A FUSE

BACKGROUND OF THE INVENTION

The invention relates to an electronic device comprising an adjustable element which has characteristic features which are to return to a certain pattern.

The invention also relates to a radio telephone handset and a system for acting on said adjustable element.

Such an invention particularly relates to portable radio devices used in mobile telephones for which the adjustable element is the first local oscillator.

In this type of application, the telephone is to receive over a wide frequency range. It happens that, as a result of the spreading of its components, an oscillator is incapable of covering the ranges imposed by the pattern and that corrections are to be made therein. This type of corrections is made by causing a variation in the capacitance of the capacitor or the self-inductance of the coil forming the oscillator resonant circuit.

On this subject could be consulted the French Patent document FR 2 612 017.

The drawback of all this is that the tuning at the end of the manufacturing process remains a costly operation, because the adjustment of the value of a capacitor or of a self-inductance takes time.

The present invention proposes a device of the type defined in the opening paragraph whose adjustment becomes extremely simple.

OBJECT AND SUMMARY OF THE INVENTION

Therefore, such a device is characterized in that said adjustable element comprises a correction element which can be switched by a fuse.

It is noted that the fact that a fuse can be melted is a simple operation which can be rapidly executed and rendered automatic for a check circuit operated at the end of the manufacturing process.

These and other aspects of the invention will be apparent from and elucidated with reference to the embodiments described hereinafter.

DETAILED DESCRIPTION OF THE PREFERRED EMBODIMENT

Figure 1:
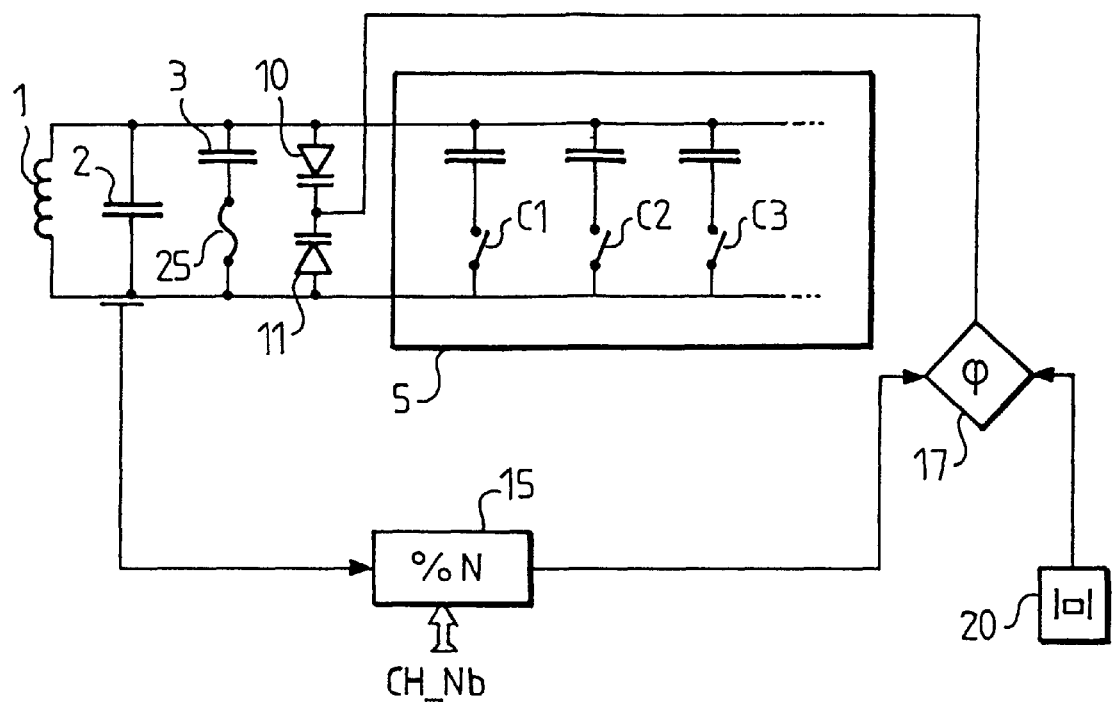
FIG. 1 shows a first electronic device according to the invention.

In FIG. 1 is shown an oscillator circuit formed by an inductance coil 1, a first external fixed capacitor 2, and a second fixed capacitor 3 connected in parallel to the first one. An integrated circuit 5 contains the active elements which permit of generating the oscillation whose frequency is determined partly by the value of these components 1 and 2. The frequency of this oscillator may be changed by varying a bias voltage of variable diodes 10 and 11. This voltage is produced by a phase-locked loop. This loop is formed by a variable frequency divider 15 whose input derives part of the oscillation and whose output produces a wave whose frequency is equal to the frequency of the input signal divided by a number CH_Nb, and a phase detector 17 of which a first input receives the output signal of the divider 15, and of which a second input receives a reference signal produced by a quartz oscillator 20.

Before delivering the apparatus to the client, it is suitable to check whether the oscillator is capable of functioning in the whole frequency range for which it is designed. In other terms, it is to be capable of oscillating for any number CH_Nb.

If this oscillation does not occur, according to the invention a fuse 25 is provided. If the oscillation does not take place for a channel, this fuse 25 is melted.

According to the preferred embodiment, the circuit 5 is a circuit manufactured by Motorola registered MC13110/ MC1311. Although this circuit already comprises switchable capacitors C1, C2, C3 . . . in the oscillation circuit, it has been found that these are sometimes insufficient capacitors to ensure the desired frequency coverage. When the invention is implemented with this integrated circuit, it guarantees oscillation for all the desired channels in 99% of the cases. In this preferred embodiment the fuse is a CMS component of size 805, thus a small-sized component.

Figure 2:
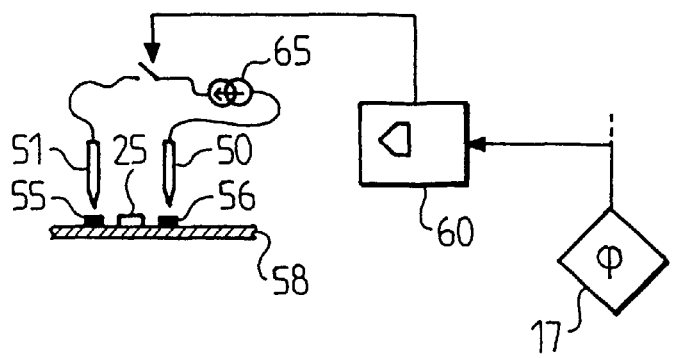
FIG. 2 shows a system for melting a fuse according to the invention.

In FIG. 2 is shown a system for melting the fuse. In this Figure the references which are identical to those of the preceding Figure refer to like elements.

Two switch needles 50 and 51 may be brought into contact with the ends 55 and 56 of the fuse 25 which is shown as being disposed on a printed circuit 58. The components of the device are positioned on this circuit. Then, by means of a comparing circuit 60, the output voltage of the phase detector 17 is analyzed for each of the numbers CH_Nb. If this voltage corresponds to a median voltage relative to maximum and minimum stop voltages, the fuse is not melted. If one has a voltage equal to a stop value, a current generator 65 is used and its current, passing through the switch needles 50 and 51 and the contacts 55 and 56, melts the fuse 25.

The invention can also be applied to radio transmitters which have to oscillate over a wide range.

I claim:

1. An oscillating device comprising:
a voltage controlled oscillator having a pair of diodes and a resonant circuit, said voltage controlled oscillator being connected to an integrated circuit having capacitive elements; said pair of diodes having anodes and common cathodes, said anodes being connected across said capacitive elements; wherein said resonant circuit includes an inductor and a first capacitor connected in parallel, and a second capacitor connected in series with a fuse; said second capacitor and said fuse being connected in parallel to said first capacitor; and
a phase locked loop comprising a frequency divider and a phase detector, said frequency divider having an input connected to an output of said voltage controlled oscillator and an output connected to an input of said phase detector, wherein said phase detector provides a voltage controlling signal to said pair of diodes.

2. The oscillating device of claim 1, wherein said phase detector provides said voltage controlling signal to said pair of diodes on a signal line connected between an output of said phase detector and said common cathodes.

3. The oscillating device of claim 1, further comprising a disabling device which disables said fuse to disconnect said second capacitor from said first capacitor.

4. The oscillating device of claim 1, further comprising a melting device which melts said fuse to disconnect said second capacitor from said first capacitor.

5. The oscillating device of claim 3, wherein said disabling device includes an electrode which is selectively connected to a current source in response to a control signal from a control device to melt said fuse and disconnect said second capacitor from said first capacitor.

6. The oscillating device of claim 5, wherein said control device compares said voltage controlling signal from said phase detector with a predetermined value.

7. The oscillating device of claim 5, wherein said control device outputs said control signal when said voltage controlling signal is outside a predetermined range.

8. The oscillating device of claim 1, wherein said frequency divider is a variable frequency divider which divides a frequency of said voltage controlled oscillator in response to a variable threshold.

9. An oscillating device comprising:

a voltage controlled oscillator having diodes and a resonant circuit, said voltage controlled oscillator being connected to an integrated circuit having capacitive elements; said diodes being connected across said capacitive elements; wherein said resonant circuit includes an inductor and a first capacitor connected in parallel, and a second capacitor connected in series with a fuse; said second capacitor and said fuse being connected in parallel to said first capacitor; and a phase locked loop comprising a frequency divider and a phase detector, said frequency divider having an input connected to an output of said voltage controlled oscillator and an output connected to an input of said phase detector, wherein said phase detector provides a voltage controlling signal to said diodes.

10. The oscillating device of claim 9, further comprising a disabling device which disables said fuse to disconnect said second capacitor from said first capacitor.

11. The oscillating device of claim 9, further comprising a melting device which melts said fuse to disconnect said second capacitor from said first capacitor.

12. The oscillating device of claim 11, wherein said melting device includes an electrode which is selectively connected to a current source in response to a control signal from a control device.

13. The oscillating device of claim 12, wherein said control device compares said voltage controlling signal from said phase detector with a predetermined value.

14. The oscillating device of claim 12, wherein said control device outputs said control signal when said voltage controlling signal is outside a predetermined range.

15. The oscillating device of claim 9, wherein said frequency divider is a variable frequency divider which divides a frequency of said voltage controlled oscillator in response to a variable threshold.

16. An oscillating device comprising:

a voltage controlled oscillator having diodes and a resonant circuit, said voltage controlled oscillator being connected to an integrated circuit having capacitive elements; said diodes being connected across said capacitive elements; wherein said resonant circuit includes an inductor and a first capacitor connected in parallel, and a second capacitor connected in series with a fuse; said second capacitor and said fuse being connected in parallel to said first capacitor;

a phase locked loop comprising a frequency divider and a phase detector, said frequency divider having an input connected to an output of said voltage controlled oscillator and an output connected to an input of said phase detector, wherein said phase detector provides a voltage controlling signal to said diodes; and a disabling device which disables said fuse to disconnect said second capacitor from said first capacitor.

17. The oscillating device of claim 16, wherein said disabling device includes an electrode which is selectively connected to a current source in response to a control signal from a control device to melt said fuse.

18. The oscillating device of claim 17, wherein said control device compares said voltage controlling signal from said phase detector with a predetermined value.

19. The oscillating device of claim 17, wherein said control device outputs said control signal when said voltage controlling signal is outside a predetermined range.

20. The oscillating device of claim 16, wherein said frequency divider is a variable frequency divider which divides a frequency of said voltage controlled oscillator in response to a variable threshold.

\* \* \* \* \*